United States Patent [19]

Hani et al.

[11] Patent Number: 4,578,308

[45] Date of Patent: Mar. 25, 1986

[54] LAMINATED BOARD LINED WITH THERMALLY AND ELECTRICALLY CONDUCTIVE MATERIAL

[75] Inventors: Kiyoshi Hani, Sagamihara; Takako Takei, Tokyo; Minekazu Kodama, Takatsuki; Toshiyuki Sugano, Atsugi, all of Japan

[73] Assignee: Mitsubishi Denki Kabushiki Kaisha, Tokyo, Japan

[21] Appl. No.: 647,638

[22] Filed: Sep. 6, 1984

[30] Foreign Application Priority Data

Oct. 14, 1983 [JP] Japan ................... 58-192090

[51] Int. Cl.4 .................... B32B 5/22; B32B 15/12
[52] U.S. Cl. .................... 428/297; 428/299; 428/464; 428/469; 428/903
[58] Field of Search ............ 428/903, 297, 299, 464, 428/469

[56] References Cited

U.S. PATENT DOCUMENTS 4,486,505 12/1984 Fushiki et al. ............ 428/464 X
4,501,787 2/1985 Marchetti et al. .......... 428/464 X

OTHER PUBLICATIONS

Gates et al., *Electronic Packaging & Production*, "Quartz Fiber in PCBs Improves . . . ", May 1983, pp. 68-73.

*Primary Examiner*—Thomas J. Herbert
*Attorney, Agent, or Firm*—Oblon, Fisher, Spivak, McClelland & Maier

[57] ABSTRACT

A laminated board lined with thermally and electrically conductive material, which comprises:

(a) a prepreg sheet formed of an alumina paper made from a mixture of alumina fibril, as the principal component, having a fiber diameter of 100 microns or smaller and a fiber length which is ten times or more as long as the fiber diameter, and microfibrillar organic fiber as a binding agent, and a thermosetting resin; and (b) an electrically conductive material in foil such as copper or aluminum bonded to said prepreg sheet.

10 Claims, No Drawings

LAMINATED BOARD LINED WITH THERMALLY AND ELECTRICALLY CONDUCTIVE MATERIAL

BACKGROUND OF THE INVENTION

1. Field of the Invention

This invention relates to a laminated board lined with an electrically conductive material such as copper or aluminum, and being excellent in its heat conductivity, dimensional stability, heat resistance, and electrical characteristics.

2. Description of the Prior Art

As the material for printed circuit wiring, there has so far been used a laminated board made up of a prepreg sheet obtained by subjecting a base material such as paper, polyester cloth, glass fiber cloth, etc. to impregnation treatment with a thermosetting resin such as phenolic resin, epoxy resin, and so on; and a copper foil laminated on the thus obtained prepreg sheet.

As the representative material for the printed circuit wiring board, there can be exemplified a paper/phenolic resin board which is manufactured by bonding a copper foil to the laminated board of paper and phenolic resin with use of adhesive agent; and a glass/epoxy resin board which is manufactured by laminating a copper foil onto a prepreg sheet of glass base material and epoxy resin, and shaping the laminate into a desired shape. Both these laminated boards possess excellent characteristics in their performance and can be manufactured at a low cost, hence they occupy an important position as the raw material for the printed circuit wiring board. While the paper/phenolic resin board is somewhat inferior to the glass/epoxy resin board in the aspect of its performance, it is a favorable material in the aspect of its manufacturing cost.

Also, since the epoxy resin/glass board is excellent in its mechanical strength, heat resistance, dimensional stability, and others, it finds its use as the substrate material for the printed circuit wiring board having high packaging density, and also as the substrate material for the multi-layered printed circuit wiring board.

However, in view of strong demand, in recent years, for a more reduced size, higher performance, and, moreover, longer service life of electronic parts and electronic appliances, high integration in the electronic parts has progressed greatly, and remarkable development in the high density packaging has been attained in the packaging technique. With progress and development in these high integration and high packaging techniques, the present situation is such that the printed circuit wiring board has also been required to have high performance. For instance, with increase in the packaging density, thinning of the circuit wiring pattern and multi-layered technique of the base board have been the important problems. Further, with progress in the high density packaging, those electronic parts are required to have improved heat dissipation characteristics, on account of which the printed circuit wiring board should have high heat conductive property. In order for the copper-lined laminated board for the printed circuit wiring to fulfil the above-mentioned requirements, there are some points of problem which cannot be overcome by the performances of the above-described conventional paper/phenolic resin board and glass/epoxy resin board. For instance, in the case of the paper/phenolic resin board, since the base material is of paper, its heat resistant property is poor, and, moreover, when manufacturing the substrate for the multi-layered printed circuit wiring board, the dimensional stability becomes a problem. Further, since the paper/phenolic resin board requires an adhesive agent when it is fastened together with the copper foil, it accompanies a disadvantage in the fabrication of the multi-layered printed circuit wiring board. On the other hand, the glass/epoxy resin board is excellent in its heat-resistant property of the base material and yet the adhesive strength between epoxy resin and the copper foil are excellent, on account of which the board is said to be useful for the thinning of the circuit wiring pattern and as the substrate material for the multi-layered printed circuit wiring board, although it still has many points to be improved for satisfying the above-mentioned requirements. For example, as to its heat conductivity, the heat conductivity of the glass base material is in a range of from 0.6 to 1.0 Kcal/m.hr.° C. or so, while that of the thermosetting resin such as epoxy resin, polyimide resin, etc. is in a range of from 0.2 to 0.3 Kcal/ m.hr.° C. On account of this, it is impossible for the laminated shaped article as the composite product of both glass and thermosetting resin materials to attain its heat conductivity greater than that of the glass base material. In the substrate of the printed circuit wiring board for the high density packaging, it is a grave disadvantage that the printed circuit wiring board having the upper limit value of the heat conductivity of only 1 Kcal/m.hr.° C. or lower can be manufactured, in spite of the printed circuit wiring board being required to function as the heat dissipating board for electronic parts. Further, as for its dimensional stability, the glass base material is usually made of glass fiber cloth, owing to which it has anisotropy in its dimensional stability. Improvement in this property is therefore indispensable in the fabrication of the multi-layered printed circuit wiring board. In other words, a laminated shaped material having excellent isotropy and dimensional stability is needed.

SUMMARY OF THE INVENTION

The present invention has been made with a view to removing the disadvantages inherent in the conventional laminated board as described in the foregoing, and aims at providing a laminated board lined with a heat conductive copper or aluminum foil and having excellent heat conductivity, dimensional stability, heat resistance, and electrical insulation.

According to the present invention, in one aspect of it, there is provided a laminated board lined with a thermally and electrically conductive material, which is constructed with: a prepreg sheet formed of alumina paper made from a mixture of alumina fibril, as the principal component, having a fiber diameter of 100 microns or smaller and a fiber length which is 10 times or more as long as the fiber diameter, and organic fiber in a microfibrillar form as a binding agent, and a thermosetting resin; and an electrically conductive material in foil such as copper or aluminum bonded to said prepreg sheet, the thus obtained laminated board lined with the thermally and electrically conductive material having excellent heat conductivity, dimensional stability, electrical insulation, and mechanical strength.

According to the present invention, in another aspect of it, there is provided a laminated board lined with a thermally and electrically conductive material, which is constructed with: a prepreg sheet formed of alumina paper made from a mixture composed of alumina fibril, as the principal component, having a fiber diameter of 100 microns or smaller and a fiber length which is 10 times or more as long as the fiber diameter, and organic fiber in a microfibrillar form as a binding agent, and a thermosetting resin in mixture with a heat-conductive filler having an average particle size of from 0.1 to 60 microns; and an electrically conductive material in foil such as copper or aluminum bonded to said prepreg sheet, the thus obtained laminated board lined with the thermally and electrically conductive material having more excellent heat conductivity, dimensional stability, electrical insulatin, and mechanical strength.

The above objects and still other objects, advantages, and features of the present invention will become more readily apparent and understandable from consideration of the following detailed description thereof, especially when taken in conjunction with several preferred examples for the practice of the invention.

DETAILED DESCRIPTION OF THE INVENTION

For the alumina fibril to be used in the present invention, there may be employed, in appropriate selection, whiskers and fibers having an aspect ratio of more than 10 and being available in general market. The term "fibril" as used throughout the present specification is a general designation embracing microfibers such as whisker and fibrous particles and those fibers having the fiber length of a few tens of millimeters, or mostly 30 millimeters.

The fiber diameter of the above-mentioned alumina fibril is no larger than 100 microns, and its fiber length is ten times or more as long as the fiber diameter. When the fiber diameter is larger than 100 microns, the alumina paper as manufactured lacks in its pliability. On the contrary, when the fiber length is shorter than ten times or less of the fiber diameter, no paper-making can be done. Also, when the fiber length is a few tens of millimeter or longer (substantially 30 mm or longer), the fiber cannot be dispersed uniformly at the time of preparing the paper-making solution, on account of which thickness of the resulting paper becomes non-uniform.

For the organic fiber as the binder of the present invention, cellulose fiber as an ordinary paper-making material, for example, is the most effective. Besides this, there may also be used cellulosic derivatives or various synthetic fibers, in which the single fiber diameter has been reduced to micro-fibril of 1 micron or less. When the single fiber diameter becomes 1 micron or larger, the mechanical strength of the resulting alumina paper decreases. Therefore, when sufficient mechanical strength is to be given to the alumina paper with addition of a small quantity of organic fiber as the binder, the fiber diameter should preferably be 1 micron or less. The quantity of the binding agent should preferably be in a range of from 0.5 to 10% by weight with respect to the above-mentioned alumina fiber. When the quantity of use of the binding agent is 0.5% by weight or less, the strength of the alumina paper is reduced. On the contrary, when it is 10% by weight or more, the alumina content decreases, whereby the characteristic of alumina diminishes.

For the thermosetting resin to be used in the present invention, the following may be appropriately chosen for use: solvent type or non-solvent type epoxy resin, triazine resin, maleimide resin, polyimide resin, silicone resin, phenolic resin, urea resin, melamine resin, polyester resin, diaryl phthalate resin, polybutadiene resin, xylene resin, alkyl benzene resin, and modified resins of these.

For the heat conductive filler of the present invention, there may be used alumina, magnesia, beryllium oxide, boron nitride, and so forth having an average particle diameter ranging from 0.1 to 60 microns. Any of the fillers having the average particle size within the above-mentioned range may be used with satisfaction. If the average particle diameter of the filler is outside the above-mentioned range, unfavorable phenomena take place such that viscosity of the resin increases, and impregnation of the filler into the alumina paper lowers. A mixing ratio of the heat conductive filler with the thermosetting resin should preferably be in a range of from 10 to 60% by weight with respect to the resin content in the thermosetting resin. Within the above-mentioned range, the impregnation treatment of the alumina paper with the heat conductive filler becomes feasible, and there can be obtained the prepreg sheet containing in it much quantity of heat conductive filler, hence it is suited for the purpose of the present invention.

For the copper foil to be used in the present invention, ordinary rolled copper foil or electrolytic copper foil may be employed. Moreover, with a view to increasing adhesive strength of the copper foil to the prepreg sheet, there may also be used a copper foil with a black oxide film having been formed thereon by use of sodium chlorite, chromate, permanganate, and so forth.

The laminated board lined with the thermally and electrically conductive material according to the present invention is constructed with those component elements as mentioned in the foregoing, and can be obtained e.g. by a manufacturing method which will be described hereinbelow. Namely, a predetermined quantity of the aforementioned alumina fiber is first put into a large quantity of dispersion medium such as water or organic solvent, etc., then a small quantity of organic fiber in a microfibrillar form as a binding agent having a single fiber diameter of 1 microns or small is added to the alumina fiber in the dispersion medium, followed by high speed agitation of the mixture to uniformly disperse the alumina fiber and to get the organic fiber as the binding agent entangled on the surface of the alumina fiber, and, thereafter, the dispersion is subjected to the paper-making process by means of a long net type or a round net type paper-making machine, thereby obtaining the alumina paper for use in the laminated board according to one embodiment of the present invention. It is to be noted that this alumina paper can be subjected to the surface treatment with a coupling agent such as a titanium compound or a silicone, compound, as a sort of pre-treatment for impregnation of the thermosetting resin (to be explained later). In the next place, the thermosetting resin is impregnated in the above-mentioned alumina paper, followed by drying the same, from which a prepreg sheet in a semi-cured condition (B stage) is obtained. Onto this prepreg sheet, the electrically conductive material in foil such as copper or aluminum is laminated and shaped to thereby obtain the laminated board lined with the thermally and electrically conductive material according to one embodiment of the present invention.

Further, the laminated board lined with the thermally and electrically conductive material according to another embodiment of the present invention can be obtained by impregnating the alumina paper manufactured by the aforedescribed method of production with the above-mentioned thermosetting resin mixed with the above-mentioned heat conductive filler, followed by drying the same to obtain the prepreg sheet in a semi-cured condition (B stage), onto which the electrically conductive material in foil such as copper or aluminum is laminated and shaped in a desired shape.

With a view to enabling those persons skilled in the art to reduce the present invention into practice, concrete explanations will be given in the following in reference to preferred examples thereof, it being understood that these examples are illustrative only and not so restrictive, and that any changes and modifications may be made in the ingredients used and various parameters within the spirit and scope of the invention as recited in the appended claims.

EXAMPLE 1

100 g of alumina fibril ("SUFFIL" ®, a product of ICI) having a fiber diameter of 3 microns and a fiber length of from 50 to 100 microns was weighed and placed in a vessel of a 20-liter capacity. Following this, 266.5 g of cellulose fiber ("MFC" ® having water content of 98%, a product of Dicel Chemical Co., Japan) was added to the alumina fibril as a binding agent for the same. To this mixture, there was further added 8.48 g of water resisting agent ("KAIMEN 557H" ® having a concentration of 1.25%, a product of Dick Hercury, Inc., USA), followed by addition of 10 liters of water into the vessel. Subsequently, with a view to disaggregating the alumina fibril and also uniformly dispersing the cellulose fiber, the entire batch was subjected to agitation for five minutes by means of a high speed agitator (of Kohless type, manufactured by Shimazaki Seisakusho, Co. Ltd., Japan). After the agitation, the resulted mixed liquid was weighed for 230 ml exact, and subjected to the paper-making process by means of a square sheet machine (manufactured by Kumagai Riki Kogyo K.K., Japan) to obtain alumina paper if a 250 mm×250 mm size. After the paper-making process, the paper was dried at a temperature of 160° C., thereby obtaining the alumina paper having an alumina content of 94% and a tensile strength of 36.3 kg/cm$^2$.

Thereafter, the alumina paper was impregnated with epoxy resins A and B as shown in Table 1 below, and the thus impregnated paper was dried to produce prepreg sheets (A and B) with the above-mentioned alumina paper as the base material.

Using the thus obtained prepreg sheet, the laminated board lined with a copper foil was manufactured by the undermentioned process. Each of the prepreg sheets A and B was laminated into 16 layers, and a copper foil ("TC FOIL" ®, a product of Nippon Mining Co. Ltd., Japan) having thickness of 35 m was placed on the topmost layer of the prepreg sheet. The laminate was held between a pair of mirror-faced stainless steel plates in a sandwich form, and subjected to press forming process at 160° C. to bring the laminate into a final shape. The press-curing of the laminate was conducted for 30 minutes in a press machine under the curing condition of 160° C. and a pressure. Thereafter, the laminate was released from the press machine. Then, the press-formed laminate was subjected to aging process at a temperature of 180° C. for one hour, thereby obtaining the laminated boards (A and B) with attachment of copper foil, which were designated as specimen 1 and specimen 2.

TABLE 1

| Epoxy resin (1) | Name | Mixing quantity (g) | Drying conditions |
|---|---|---|---|
| A | EPIKOTE 828 | 100 | 160° C. for 10 min. |
|  | DDS | 20 |  |
|  | BF$_3$-400 | 1 |  |
|  | Methyl/ethyl ketone | 90 |  |
| B | EPIKOTE 1045-A-80 | 100 | 160° C. for 4 min. |
|  | Dicy | 3.2 |  |
|  | BDMA | 0.16 |  |
|  | Methyloxytol | 30 |  |

Note:
(1) Epoxy resin: produced by Yuka-Shell Co. Ltd.

EXAMPLE 2

Paper-making liquid for the alumina paper was prepared in the same manner as in Example 1 above using 100 g of alumina fibril ("SUFFIL" ®, a product of ICI), 156.0 g of cellulose fiber ("MFC" ®, Dicel Chemical Co. Ltd., Japan), 8.32 g of water resisting agent ("KAIMEN 557H" ®, a product of Dick Hercurys, Inc., USA), and 10 liters of water. From this paper-making liquid in a quantity of 225 ml, there was obtained alumina paper having a paper thickness of approximately 0.15 mm, alumina content of 96.0%, and a tensile strength of 33.1 kg/cm$^2$ by the same paper-making process as in Example 1 above.

Subsequently, the thus obtained alumina paper was impregnated with each of epoxy resins A and B as shown in Table 1 above, and the thus impregnated alumina paper was dried and used to produce prepreg sheets with it as the base material. Using the thus obtained prepreg sheets, the laminated board lined with a copper foil was manufactured by the same method as in Example 1 above, each of which was designated as specimens 3 and 4.

EXAMPLE 3

The alumina paper obtained by the same method as in Example 1 above was subjected to the surface treatment with a titanium type coupling agent ("KR-44" ®, a product of Ajinomoto Co., Ltd., Japan). The surface treatment was conducted in such a manner that KR-44 was first adjusted with isopropyl alcohol to render its concentration to be 0.02% by weight, and then the alumina paper was immersed into this solution, followed by drying the same for 30 minutes at a temperature of 100° C. The thus surface-treated alumina paper was impregnated with the epoxy resin A as shown in Table 1 above, and the prepreg sheet was manufactured in the same manner as in Example 1 above. A copper foil was then laminated on the prepreg sheet, followed by shaping the laminate under pressure to obtain a shaped article of 1.2 mm thick. The thus produced laminated board lined with the copper foil had favorable characteristics such that the bending strength was 0.3 kg/mm$^2$ and the thermal conductivity was 2.01 Kcal/m.hr.° C.

EXAMPLE 4

With the same compositional ratio as that in Example 1 above, the paper-making liquid for the alumina paper was prepared. Using 460 ml of the paper-making liquid, the alumina paper having thickness of approximately 0.30 mm was obtained in exactly the same manner as in Example 1 above.

Subsequently, this alumina paper was subjected to the surface treatment with a silicon type coupling agent ("A-187" ®, Nippon Unicar K.K.). The surface treatment method was such that A-187 was dissolved in a solution of methanol and water (methanol: $H_2O = 9:1$) to a concentration of 0.09% by weight, and then the alumina paper was impregnated with this solution, followed by drying the same at a temperature of 120° C. for one hour. The thus treated alumina paper was impregnated with maleimide resin ("CHELIMIDE 601" ®, a product of Mitsui Petrochemical Co. Ltd.) to thereby produce the prepreg sheet. Ten sheets of the prepreg sheet were laminated, and a copper foil ("GTC FOIL" ®, a product of Nippon Mining Co. Ltd., Japan) of 12 μm thick was placed over the topmost sheet, which was then subjected to shaping. The resulting laminate was designated as specimen 5. The shaping conditions for this laminate were such that the laminated body was held for five minutes in a press machine at a temperature of 180° C. under a contact pressure or the like pressure, after which the pressure was increased to 35 kg/cm² and the laminated body was held under that pressure for two hours. Subsequently, the temperature was lowered in this state of the increased pressure. As soon as the temperature of the press machine reached a level of 40° C., the shaped article was taken outside.

EXAMPLE 5

In the same manner of paper-making process as in Example 1 above, the alumina paper of approximately 0.30 mm thick was produced from 450 ml of the paper-making solution used in Example 2 above.

In the next place, this alumina paper was subjected to the surface treatment and the lamination and shaping process in the same manner as in Example 4 above, thereby obtaining the laminated board with the copper foil being attached thereto, which was designated as specimen 6.

EXAMPLES 6 to 14

The alumina paper, the epoxy resin, and the heatconductive filler as used in each of the preceding Examples 1 through 5 were used in a manner as indicated in Table 2 below, thereby manufacturing a variety of laminated boards with attachment of the copper foil thereto.

More particularly, a predetermined quantity of the heat-conductive filler of varying kinds was blended with the epoxy resin of different kinds, as shown in Table 2 below, and the mixtures were agitated until each batch of the mixtures attained desired uniformity. Each of the mixed liquids was impregnated in the above-mentioned alumina paper, and then the thus impregnated paper was dried under the predetermined conditions for the epoxy resin used, as shown in Table 1 above, whereby tuck-free prepreg sheet of various kinds was obtained. This impregnation treatment of the alumina paper with the mixture of the epoxy resin and the heat conductive filler was carried out while agitating the mixed liquid, since it was necessary that the heat conductive filler be adhered uniformly and evenly onto the alumina paper.

Predetermined numbers of the prepreg sheets were laminated, over the topmost sheet of which a single sheet of the copper foil of 35 μm thick ("TC FOIL" ®, a product of Nippon Mining Co. Ltd., Japan) was placed. Then, the laminated body was held between a pair of mirror-faced stainless steel plates in a sandwich form so as to carry out the lamination and shaping process by means of a press machine at a temperature of 16° C. The shaping conditions of the laminated body were such that it was held for ten minutes in the press machine under a contact pressure (2 to 3 kg/cm²), after which the pressure was increased to 35 kg/cm², and the laminated body was held for 40 minutes under that pressure condition. After this, the temperature of the press machine was lowered under this increased pressure level. As soon as the temperature, reached 50° C., the shaped article was taken out of the press machine. Each of the resulted laminated boards lined with the copper foil was found to be excellent in its outer appearance free from undesirable twisting and warping. Each of these shaped articles was designated as specimens 7 to 15.

TABLE 2

| Example | Alumina paper composition and film thickness | Epoxy resin (1) | Heat conductive filler Name | Mixing quantity (g) |
|---|---|---|---|---|
| 6 | Example 1 Approx. 0.3 mm | A | Alumina (2) (WA #6000) | 75 |
| 7 | same as above same as above | A | Boron nitride (3) (UHP-EX) | 30 |
| 8 | same as above Approx. 0.15 mm | A | Alumina (2) (WA #800) | 150 |
| 9 | same as above same as above | A | Boron nitride (3) (UHP-EX) | 50 |
| 10 | same as above same as above | A | Magnesia (4) High temp. sintered magnesia | 100 |
| 11 | Example 1 Approx. 0.3 mm | B | Alumina (2) (WA #6000) | 90 |
| 12 | same as above same as above | B | Alumina (2) (WA #6000 | 120 |
| 13 | Example 2 0.3 mm | B | Magnesia (4) High temp. sintered magnesia | 60 |
| 14 | same as above same as above | B | Magnesia (4) High temp. sintered | 80 |

Note:
(1) Yuka-Shell K.K.
(2) Fujimi Kenmazai Kogyo K.K.
(3) Showa Denko K.K.
(4) Kyowa Chemical Industry, Ltd.

EXAMPLES 15 and 16

As in Example 4 and 5 above, the alumina paper was subjected to the surface treatment with a silicon type coupling agent ("A-187" ®, a product of Nippon Unicar, Co., Ltd., Japan).

The thus surface-treated alumina paper was then impregnated with a mixed resin liquid composed of 200 parts by weight of bismaleimide/triazine resin ("BT RESIN" ®, BT-2110, a product of Mitsubishi Gas Chemical Co., Ltd., Japan) and 60 parts by weight of high temperature sintered magnesia (a product of Kyowa Chemical Industry Co., Ltd., Japan). After the impregnation-treatment, the thus treated alumina paper was dried for ten minutes at a temperature of 145° C., thereby obtaining tuck-free prepreg sheet. Ten sheets of the prepreg sheet were laminated, and a single sheet of copper foil of 12 μm ("GTC FOIL" ®, a product of Nippon Mining Co. Ltd., Japan) was placed over the topmost layer of the prepreg sheet, followed by the lamination and shaping process. The shaping conditions of the laminated body were such that it was held for ten minutes in a press machine at a temperature of 175° C. under a contact pressure (3 to 4 kg/cm²), and then the pressure was increased to 35 kg/cm², under which pressure level the laminated body was maintained for approximately 60 minutes. Thereafter, the temperature was lowered, and, so soon as the temperature level reached 40° C., the shaped article was taken out of the press machine. Subsequently, the shaped article was subjected to the aging process at a heating temperature of 230° C. for one hour. In this way, there could be obtained the laminated board lined with the copper foil and being excellent in its outer appearance free from undesirable twisting and warping. The thus obtained lamianted boards were respectively designated specimens 16 and 17.

Measurements on Various Properties of the Laminated Boards with Attachment of Copper Foil Thereto Table 3 below indicates the results of measurements on various properties of the specimens obtained by the afore-described Examples.

bonded to said prepreg sheet. The present invention is also capable of providing a laminated board lined with a thermally and electrically conductive material and being more excellent in its heat conductivity, dimensional stability, electrical insualtion, and mechanical strength, the laminated board being constructed with: a prepreg sheet formed of alumina paper made from a mixture composed of alumina fibril, as the principal component, having a fiber diameter of 100 microns or smaller and a fiber length which is 10 times or more as long as the fiber diameter, and microfibrillar organic fiber as a binding agent, and a thermosetting resin in mixture with a heat-conductive filler having an average particle size of from 0.1 to 60 microns; and an electrically conductive material in foil such as copper or aluminum bonded to said prepreg sheet. Such laminated board is suitable for printed circuit wiring board of high packaging density, multi-layered printed circuit wiring

TABLE 3

| Specimen No. | Example | Bending strength (kg/mm$^2$) | Heat conductivity (Kcal/m. hr. °C.) | Ratio of dimensional change[1] (%) | Volume specific resistance (Ω · cm) | Alumina paper | | | Impregnated resin | Filler |
| --- | --- | --- | --- | --- | --- | --- | --- | --- | --- | --- |
| | | | | | | Composition | Film thickness (mm) | Surface treatment | | |
| 1 | 1 | 51 | 1.93 | 0.07 / 0.02 | 3.6 × 10$^{15}$ | Example 1 | 0.15 | — | Epoxy A | — |
| 2 | 1 | 43 | 1.90 | 0.15 / 0.11 | 1.0 × 10$^{15}$ | " | 0.15 | — | Epoxy B | — |
| 3 | 2 | 57 | 2.16 | 0.04 / 0.03 | 5.5 × 10$^{15}$ | Example 2 | 0.15 | — | Epoxy A | — |
| 4 | 2 | 49 | 2.05 | 0.13 / 0.09 | 1.2 × 10$^{15}$ | " | 0.15 | — | Epoxy B | — |
| 5 | 4 | (25° C.) 47 (180° C.) 44 | 1.95 | — | 2.1 × 10$^{16}$ | Example 1 | 0.30 | Si | Maleimide | — |
| 6 | 5 | (25° C.) 50 (180° C.) 49 | 2.15 | — | 3.7 × 10$^{16}$ | Example 2 | 0.30 | Si | " | — |
| 7 | 6 | 51 | 2.11 | — | 5.6 × 10$^{15}$ | Example 1 | 0.30 | — | A | Al |
| 8 | 7 | 48 | 2.05 | — | 1.2 × 10$^{15}$ | " | 0.3 | — | A | B |
| 9 | 8 | 43 | 2.83 | — | 1.5 × 10$^{15}$ | " | 0.15 | — | A | Al |
| 10 | 9 | 39 | 2.21 | — | 6.7 × 10$^{14}$ | " | 0.15 | — | A | B |
| 11 | 10 | 43 | 2.53 | — | 4.3 × 10$^{15}$ | " | 0.15 | — | A | Mg |
| 12 | 11 | 47 | 2.37 | — | 7.3 × 10$^{15}$ | " | 0.30 | — | B | Al |
| 13 | 12 | 45 | 2.73 | — | 2.1 × 10$^{15}$ | " | 0.30 | — | B | Al |
| 14 | 13 | 50 | 2.16 | — | 5.2 × 10$^{15}$ | Example 2 | 0.30 | — | B | Mg |
| 15 | 14 | 52 | 2.45 | — | 4.0 × 10$^{15}$ | " | 0.30 | — | B | Mg |
| 16 | 15 | (25° C.) 52 (150° C.) 49 | 2.47 | — | 4.93 × 10$^{15}$ | Example 1 | 0.30 | Si | Bismaleimide Triazine | Mg |
| 17 | 16 | (25° C.) 54 (150° C.) 50 | 2.56 | — | 4.65 × 10$^{15}$ | Example 2 | 0.30 | Si | Bismaleimide Triazine | Mg |

Note
[1]Ratio of dimensional change after heating for 600 hours at 150° C. (figures in the upper part denoting change ratio in the longitudinal direction; figures in the lower part denoting change ratio in the thickness direction)

From the Table, it will be appreciated that the copper-lined laminated board according to the present invention with the alumina paper as the base material is shown to be excellent in its mechanical property and electrical property. In particular, its heat conductivity is shown to be three to four times as high as that of the ordinary copper lined laminated board with the glass fiber cloth as the base material.

As described in the foregoing, the present invention is capable of providing a laminated board lined with a thermally and electrically conductive material and being excellent in its heat conductivity, dimensional stability, electrical insulation, and mechanical strength, the laminated board being constructed with: a prepreg sheet formed of alumina paper made from a mixture of alumina fibril, as the principal component, having a fiber diameter of 100 microns or smaller and a fiber length which is 10 times or more as long as the fiber diameter, and microfibrillar organic fiber as a binding agent, and a thermosetting resin; and an electrically conductive material in foil such as copper or aluminum board material, etc., hence its industrial value as the high performance printed circuit wiring board material is great.

What is claimed is:

1. A laminated board lined with a thermally and electrically conductive material, which comprises:
   (a) a prepreg sheet formed of an alumina paper made from a mixture of alumina fibril, as the prinicpal component, having a fiber diameter of 100 microns or smaller and a fiber length which is ten times or more as long as the fiber diameter, a microfibrillar organic fiber as a binding agent, and a thermosetting resin; and
   (b) an electrically conducitve foil bonded to said prepreg sheet.

2. The laminated board lined with thermally and electrically conductive material according to claim 1, wherein said binding agent is in a range of from 0.5% by weight to 10% by weight with respect to said principal component.

3. The laminated board lined with thermally and electrically conductive material according to claim 1, wherein the single fiber diameter of the microfibrillar organic fiber in said binding agent is 1 micron or smaller.

4. The laminated board lined with thermally and electrically conductive material according to claim 1, wherein said organic fiber as the binding agent is selected from the group consisting of cellulose fiber, cellulosic derivatives, and synthetic fibers.

5. The laminated board lined with thermally and electrically conductive material according to claim 1, wherein said electrically conductive material in foil is selected from the group consisting of copper and aluminum.

6. A laminated board lined with thermally and electrically conductive material, which comprises:
   (a) a prepreg sheet formed of alumina paper made from a mixture composed of alumina fibril, as the principal component, having a fiber diameter of 100 microns or smaller and a fiber length which is ten times or more as long as the fiber diameter, and microfibrillar organic fiber as a binding agent, and a thermosetting resin mixed with a heat-conductive filler having an average particle size of from 0.1 to 60 microns; and
   (b) an electrically conductive material bonded to said prepreg sheet.

7. The laminated board lined with thermally and electrically conductive material according to claim 6, wherein said binding agent is in a range of from 0.5% by weight to 10% by weight with respect to said principal component.

8. The laminated board lined with thermally and electrically conductive material according to claim 6, wherein a single fiber diameter of the microfibrillar organic fiber in said binding agent is 1 micron or smaller.

9. The laminated board lined with thermally and electrically conductive material of claim 6 wherein the heat-conductive filler is selected from the group consisting of alumina, magnesia, beryllium oxide, and boron nitride.

10. The laminated board lined with thermally and electrically conductive material according to claim 9, wherein said heat conductive filler is mixed in a range of from 10 to 60% by weight with respect to a resin content in the thermosetting resin.

* * * * *